（12) United States Patent
Arai

(10) Patent No.: US 10,256,825 B2
(45) Date of Patent: Apr. 9, 2019

(54) OVEN CONTROLLED CRYSTAL OSCILLATOR

(71) Applicant: NIHON DEMPA KOGYO CO., LTD., Tokyo (JP)

(72) Inventor: Junichi Arai, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 15/124,673

(22) PCT Filed: Mar. 4, 2015

(86) PCT No.: PCT/JP2015/056300
§ 371 (c)(1),
(2) Date: Sep. 8, 2016

(87) PCT Pub. No.: WO2015/137204
PCT Pub. Date: Sep. 17, 2015

(65) Prior Publication Data
US 2017/0019109 A1 Jan. 19, 2017

(30) Foreign Application Priority Data
Mar. 11, 2014 (JP) ................................ 2014-047479

(51) Int. Cl.
*H03B 5/32* (2006.01)
*H03L 1/02* (2006.01)
*H03L 1/04* (2006.01)

(52) U.S. Cl.
CPC ............. *H03L 1/028* (2013.01); *H03B 5/32* (2013.01); *H03L 1/04* (2013.01)

(58) Field of Classification Search
CPC .. H03B 5/32; H03B 5/04; H03L 1/028; H03L 1/04
(Continued)

(56) References Cited

U.S. PATENT DOCUMENTS 7,427,902 B2 * 9/2008 Matsuoka ................ H03B 5/04
331/158
8,089,325 B2 * 1/2012 Kudo ....................... H03B 1/02
331/116 FE
(Continued)

FOREIGN PATENT DOCUMENTS

CN 1770649 5/2006
CN 101399259 4/2009
(Continued)

OTHER PUBLICATIONS

"International Search Report (Form PCT/ISA/210)", dated May 19, 2015, with English translation thereof, pp. 1-4.
(Continued)

*Primary Examiner* — Arnold Kinkead
(74) *Attorney, Agent, or Firm* — JCIPRNET

(57) ABSTRACT

An oven controlled crystal oscillator that ensures reduced heat influence from outside to further stabilize an output frequency is provided. The oven controlled crystal oscillator includes a substrate secured above a base. The oven controlled crystal oscillator includes an oscillator circuit, a heater resistor, and a power transistor, which are mounted on the substrate. The oven controlled crystal oscillator includes pins that secures the substrate above the base at a predetermined interval, a metal cover that covers the oscillator circuit, the heater resistor, and the power transistor, and a resin cover that covers outside of the metal cover. An air layer is formed between the metal cover and the resin cover.

10 Claims, 5 Drawing Sheets

(58) Field of Classification Search
USPC ...... 331/158, 176, 66, 116 FE; 361/720, 783
See application file for complete search history.

(56) References Cited

U.S. PATENT DOCUMENTS

| | | | | |
|---|---|---|---|---|
| 2003/0197568 | A1* | 10/2003 | Satoh | H03B 5/36 |
| | | | | 331/158 |
| 2005/0018405 | A1 | 1/2005 | Kawano et al. | |
| 2009/0103276 | A1 | 4/2009 | Sakamoto et al. | |
| 2010/0052802 | A1 | 3/2010 | Arai | |
| 2010/0085125 | A1 | 4/2010 | Ito | |
| 2010/0123522 | A1* | 5/2010 | Kasahara | H03B 1/02 |
| | | | | 331/69 |
| 2010/0289589 | A1* | 11/2010 | Ito | H03L 1/022 |
| | | | | 331/70 |
| 2011/0193637 | A1* | 8/2011 | Kasahara | H03H 9/02102 |
| | | | | 331/68 |

FOREIGN PATENT DOCUMENTS

| | | |
|---|---|---|
| CN | 101667809 | 3/2010 |
| CN | 101719756 | 6/2010 |
| CN | 101741314 | 6/2010 |
| CN | 101895255 | 11/2010 |
| CN | 102158194 | 8/2011 |
| JP | S62114520 | 5/1987 |
| JP | H02122704 | 5/1990 |
| JP | H10154763 | 6/1998 |
| JP | 2000077940 | 3/2000 |
| JP | 2002314339 | 10/2002 |
| JP | 2003037472 | 2/2003 |
| JP | 2003309432 | 10/2003 |
| JP | 2007281913 | 10/2007 |
| JP | 2010056767 | 3/2010 |

OTHER PUBLICATIONS

"Office Action of China Counterpart Application", with English translation thereof, dated Jun. 8, 2018, p.1-p.17.

"Office Action of China Counterpart Application," dated Oct. 24, 2018, with English translation thereof, p1-p10.

* cited by examiner

OVEN CONTROLLED CRYSTAL OSCILLATOR

CROSS-REFERENCE TO RELATED APPLICATION

This application is a 371of international application of PCT application serial no. PCT/JP2015/056300, filed on Mar. 04, 2015, which claims the priority benefits of Japan application no. JP 2014-047479, filed on Mar. 11, 2014. The entirety of each of the above-mentioned patent applications is hereby incorporated by reference herein and made a part of this specification.

TECHNICAL FIELD

This invention relates to an oven controlled crystal oscillator, especially, relates to an oven controlled crystal oscillator that ensures a further stabilized output frequency by reducing a heat influence from outside.

BACKGROUND ART

[Description of Related Art]
Oven controlled crystal oscillator (OCXO; Oven Controlled Crystal Oscillator) includes an oven that keeps a crystal resonator at a constant temperature, and ensures high frequency stability.

The oven controlled crystal oscillator is used for a measuring device of high accuracy and a base station of mobile phones, for example.

[Conventional Oven Controlled Crystal Oscillator: FIG. 11]

A conventional oven controlled crystal oscillator will be described using FIG. 11. FIG. 11 is a sectional drawing illustrating a configuration of a conventional oven controlled crystal oscillator.

As illustrated in FIG. 11, a conventional surface mount device type oven controlled crystal oscillator includes a substrate 1 made of glass epoxy (glass epoxy) or similar material on which an oscillator circuit 2, which includes a crystal resonator, a heater resistor 3, which becomes a heat source, and a power transistor 4, which constitutes a temperature control circuit, are mounted.

Then, the substrate 1 with an electronic part are secured by soldering in a state of floating with a plurality of pins (lead pins) 5 at a predetermined interval above a base 6 made of glass epoxy or similar material, and the substrate 1 is electrically connected to the base 6.

Furthermore, a metal cover 7 is mounted on the base 6 so as to cover the substrate 1 and the electronic parts mounted on the substrate 1, and then sealed, to constitute a package with the base 6 and the cover 7, and a space inside the package forms an oven.

Although a drawing is omitted, a temperature sensor mounted on the substrate 1 detects a temperature inside the oven, and the temperature control circuit including the power transistor 4 controls to maintain the temperature inside the oven constant.

The OCXO maintains the inside at high temperature, which makes a device including the OCXO a heat generating component, and its exhaust heat should be taken into consideration.

For example, generating airflow inside the unit with a fan or similar mechanism to exhaust the heat may be considered.

Accordingly, the peripheral area of the OCXO mounted on the unit is constantly in a state where a wind is blown around the peripheral area, and the heat is drawn from the metal cover 7 of the OCXO.

In this case, the internal temperature drops, thereby a current that flows to the heater resistor 3 and/or the power transistor 4 increases by temperature control.

On the other hand, in the case where the unit is heated with external air rapidly, the heat is transmitted from the outside via the metal cover 7, which may reduce or turn off the current flow to the heater resistor 3.

The OCXO, which is required to be highly stable, may not be allowed to neglect a small frequency variation caused by this slight variation of the current.

[Related Art]
As techniques regarding the oven controlled crystal oscillator, Japanese Unexamined Patent Application Publication No. 2010-56767 discloses "Piezoelectric device apparatus" (NIHON DEMPA KOGYO CO., LTD., Patent Document 1), Japanese Unexamined Patent Application Publication No. 2003-37472 discloses "Composite high-frequency component and radio transmitter-receiver using the same" (HITACHI METALS, LTD., Patent Document 2), Japanese Unexamined Patent Application Publication No. H10-154763 discloses "Container for electronic component and crystal oscillator using the same" (NIHON DEMPA KOGYO CO., LTD., Patent Document 3), and Japanese Unexamined Utility Model Application Publication No. S62-114520 discloses "Piezoelectric oscillator" (NIHON DEMPA KOGYO CO., LTD., Patent Document 4).

Patent Document 1 discloses a piezoelectric device apparatus that includes a first metal case covering a piezoelectric vibrating piece, a second metal case covering the first metal case, and a base plate on which the first metal case and the second metal case are bonded.

Patent Document 2 discloses a composite high-frequency component that includes a piezoelectric crystal body and a metal case covering the piezoelectric crystal body on a multilayer substrate laminated with dielectric layers, and further disposes a second metal case outside the metal case.

Patent Document 3 discloses a configuration for a crystal controlled oscillator including a metal cover on a resin substrate to enhance positional accuracy of the metal cover with respect to the resin substrate by forming a depressed portion on the resin substrate, and forming a leg portion on the metal cover to fit together.

Patent Document 4 discloses a configuration that disposes a heat insulating material inside a resin cover that covers an oven.

CITATION LIST

Patent Document

Patent Document 1: Japanese Unexamined Patent Application Publication No. 2010-56767
Patent Document 2: Japanese Unexamined Patent Application Publication No. 2003-37472
Patent Document 3: Japanese Unexamined Patent Application Publication No. H10-154763
Patent Document 4: Japanese Unexamined Utility Model Application Publication No. S62-114520

SUMMARY

Problems To Be Solved by the Invention

As described above, a conventional oven controlled crystal oscillator is covered with a metal cover, which has an excellent thermal conductivity, on the outside. The conventional oven controlled crystal oscillator has a problem when mounted on a unit that it is susceptible to temperature changes caused by operations and/or environments of the unit on which it is mounted, and a frequency variation may be caused by a slight current variation in accordance with temperature control.

Patent Document 1 to Patent Document 4 do not disclose disposing a resin cover outside a metal cover, or disposing a metal cover outside a resin cover to make a double-cover for forming an air layer between the two covers.

The present invention is made in view of the above-described situation, and its objective is to provide an oven controlled crystal oscillator that ensures a further stabilized output frequency by reducing a heat influence from outside.

SOLUTIONS TO THE PROBLEMS

The present invention for solving the problems of the above-described conventional examples is an oven controlled crystal oscillator having a base and a substrate mounted above the base. The oven controlled crystal oscillator includes: an oscillator circuit, a heater resistor, and a temperature control circuit that are mounted on the substrate; a plurality of pins that secures the substrate above the base at a predetermined interval; a first metal cover that covers the oscillator circuit, the heat resistor, and the temperature control circuit; and a resin cover that is mounted on the base and covers the first metal cover. An air layer is formed between the first metal cover and the resin cover.

The present invention, in the above-described oven controlled crystal oscillator, is a surface mount device type with the first metal cover and the resin cover mounted on the base.

The present invention, in the above-described oven controlled crystal oscillator, includes the oscillator circuit, the heater resistor, the temperature control circuit, and the first metal cover mounted on a top surface of the substrate, and the resin cover is mounted on the base. The present invention is a pin type.

The present invention, in the above-described oven controlled crystal oscillator, includes an electronic part and a second metal cover covering the electronic part mounted on a lower surface of the substrate, and the first metal cover and the second metal cover sandwich the substrate to form openings vertically overlapping.

The present invention for solving the problems of the above-described conventional examples is an oven controlled crystal oscillator having a base and a substrate mounted above the base. The oven controlled crystal oscillator includes an oscillator circuit, a heater resistor, and a temperature control circuit that are mounted on the substrate, a plurality of pins that secures the substrate above the base at a predetermined interval, a first resin cover that covers the oscillator circuit, the heat resistor, and the temperature control circuit, and a metal cover that is mounted on the base and covers the first resin cover. An air layer is formed between the first resin cover and the metal cover.

The present invention, in the above-described oven controlled crystal oscillator, is a surface mount device type with the first resin cover and the metal cover mounted on the base.

The present invention, in the above-described oven controlled crystal oscillator, includes the oscillator circuit, the heater resistor, the temperature control circuit, and the first resin cover mounted on a top surface of the substrate, and the metal cover is mounted on the base. The present invention is a pin type.

The present invention, in the above-described oven controlled crystal oscillator, includes an electronic part and a second resin cover covering the electronic part mounted on a lower surface of the substrate, and the first resin cover and the second resin cover sandwich the substrate to form openings vertically overlapping.

The present invention, in the above-described oven controlled crystal oscillator, includes a first resin cover further covering a plurality of pins in addition to the oscillator circuit, the heater resistor, and the temperature control circuit.

The present invention, in the above-described oven controlled crystal oscillator, includes a third resin cover disposed outside the metal cover. The third resin cover covers the metal cover.

EFFECTS OF THE INVENTION

According to the present invention, the oven controlled crystal oscillator having a base and a substrate mounted above the base includes an oscillator circuit, a heater resistor, and a temperature control circuit that are mounted on the substrate, a plurality of pins that secures the substrate above the base at a predetermined interval, a first metal cover that covers the oscillator circuit, the heat resistor, and the temperature control circuit, and a resin cover that is mounted on the base and covers the first metal cover. An air layer is formed between the first metal cover and the resin cover.

Thus, the metal cover provides a shield effect, and the resin cover serves as a wind guard to reduce useless heat radiation from the metal cover to stabilize temperature control, thereby it is effective in stabilizing an output frequency.

According to the present invention, since the above-described oven controlled crystal oscillator is the surface mount device type with the first metal cover and the resin cover mounted on the base, it is effective in providing a surface mount device type oven controlled crystal oscillator of high stability according to the purpose of use at low cost.

According to the present invention, since the oscillator circuit, the heater resistor, the temperature control circuit, and the first metal cover are mounted on the top surface of the substrate, and the resin cover is mounted on the base, and the above-described oven controlled crystal oscillator is a pin type, it is effective in providing a pin type oven controlled crystal oscillator of high stability according to the purpose of use at low cost.

According to the present invention, the above-described oven controlled crystal oscillator includes the electronic part and the second metal cover covering the electronic part mounted on the lower surface of the substrate, and the first metal cover and the second metal cover sandwich the substrate to form openings vertically overlapping. Thus, the whole space formed with the first metal cover and the second metal cover as an oven ensures the further stabilized temperature control, thus effectively further stabilizing the output frequency.

According to the present invention, the oven controlled crystal oscillator with the substrate mounted above the base includes the oscillator circuit, the heater resistor, and the temperature control circuit that are mounted on the substrate, a plurality of pins that secures the substrate above the base at a predetermined interval, a first resin cover that covers the oscillator circuit, the heat resistor, and the temperature control circuit, and a metal cover that is mounted on the base and covers the first resin cover. An air layer is formed between the first resin cover and the metal cover. Thus, forming the oven with the resin cover, which is low in thermal conductivity, decreases heat radiation from the oven, and the metal cover provides the shield effect and serves as a wind guard, thereby effectively stabilizing the output frequency.

According to the present invention, since the above-described oven controlled crystal oscillator is a surface mount device type with the first resin cover and the metal cover mounted on the base, it is effective in providing a surface mount device type oven controlled crystal oscillator of high stability according to the purpose of use at low cost.

According to the present invention, since the oscillator circuit, the heater resistor, the temperature control circuit, and the first resin cover are mounted on the top surface of the substrate, the metal cover is mounted on the base, and the above-described oven controlled crystal oscillator is a pin type, it is effective in providing a pin type oven controlled crystal oscillator of high stability according to the purpose of use at low cost.

According to the present invention, the above-described oven controlled crystal oscillator includes the electronic part and the second resin cover covering the electronic part mounted on the lower surface of the substrate, and the first resin cover and the second resin cover sandwich the substrate to form openings vertically overlapping. The whole space formed with the first resin cover and the second resin cover as an oven ensures the further stabilized temperature control, and it is effective in further stabilizing the output frequency.

According to the present invention, the above-described oven controlled crystal oscillator includes the first resin cover covering the plurality of pins in addition to the oscillator circuit, the heater resistor, and the temperature control circuit, thereby keeping heat inside the oven, and temperature control can be performed with a low electric power.

According to the present invention, the above-described oven controlled crystal oscillator disposes a third resin cover covering the metal cover outside the metal cover. This avoids a wind of a fan from hitting the metal cover, which is high in thermal conductivity, with the third resin cover to reduce heat radiation, and it is effective in further stabilizing temperature control.

DESCRIPTION OF PREFERRED EMBODIMENTS

Figure 1:
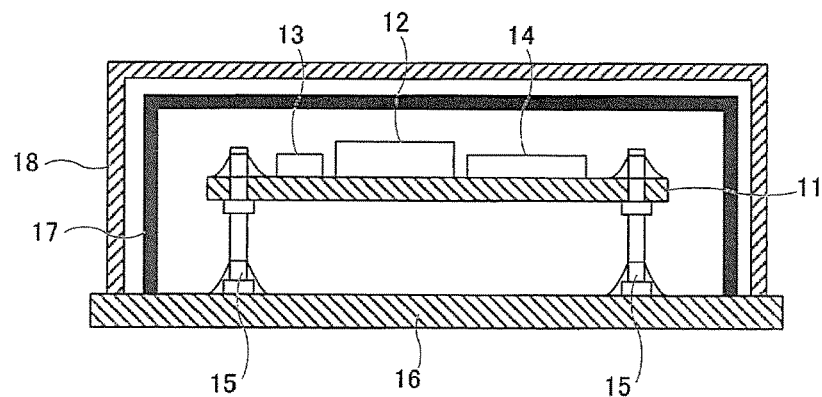
FIG. 1 is a sectional drawing illustrating a configuration of a first oven controlled crystal oscillator according to a first embodiment of the present invention.

The embodiments of the present invention will be described by referring to the drawings.

[Outline of Embodiments]

The oven controlled crystal oscillator according to an embodiment of the present invention includes a substrate on which an oscillator circuit, a heater resistor, and a temperature control circuit are mounted. The substrate is secured above a base with a plurality of pins at a predetermined interval. The oven controlled crystal oscillator includes a metal cover that covers the oscillator circuit, the heat resistor, and the temperature control circuit. Furthermore, a resin cover is mounted on the base and covers the metal cover. An air layer is formed in an appropriate space between the metal cover and the resin cover. The resin cover on the outside serves as a wind guard to prevent heat radiation from the metal cover on the inside, thereby further stabilizing the output frequency.

The oven controlled crystal oscillator according to an embodiment of the present invention includes a substrate on which an oscillator circuit, a heater resistor, and a temperature control circuit are mounted. The substrate is secured above a base with a plurality of pins at a predetermined interval. The oven controlled crystal oscillator includes a resin cover that covers the oscillator circuit, the heat resistor, and the temperature control circuit. Furthermore, a metal cover is mounted on the base and covers the resin cover. An air layer is formed in an appropriate space between the resin cover and the metal cover. The metal cover on the outside serves as a wind guard to prevent heat radiation from the resin cover on the inside, thereby further stabilizing the output frequency.

[First Embodiment]

An oven controlled crystal oscillator according to a first embodiment of the present invention will be described. The oven controlled crystal oscillator of each configuration according to the first embodiment, is all characterized in including, on the outside of a metal cover, which covers an oscillator circuit, a heater resistor, and a temperature control circuit, a resin cover one size larger than the metal cover.

A first to a third oven controlled crystal oscillator will be described as concrete examples of the oven controlled crystal oscillator according to the first embodiment.

[First Oven Controlled Crystal Oscillator: FIG. 1]

As the oven controlled crystal oscillator according to the first embodiment of the present invention, the first oven controlled crystal oscillator will be described by referring to FIG. 1. FIG. 1 is a sectional drawing illustrating a configuration of the first oven controlled crystal oscillator according to the first embodiment of the present invention.

The first oven controlled crystal oscillator is, as illustrated in FIG. 1, a surface mount device type (SMD: Surface Mounted Device) oscillator, which includes an oscillator circuit 12, a heater resistor 13, and a power transistor 14 on a substrate 11 formed of glass epoxy or similar material. The substrate 11 is secured by soldering in a state of floating with a plurality of pins 15 at a predetermined interval above a base 16, and the substrate 11 is electrically connected to the base 16. The power transistor 14 corresponds to a temperature control circuit mentioned in the claims.

Furthermore, a metal cover 17 is mounted on the base 16 so as to cover the substrate 11, and the metal cover 17 is adhesively secured on a base 16.

The shield effect is provided with the metal cover 17, and a noise from outside can be prevented.

As a feature of the first oven controlled crystal oscillator, a resin cover 18 is additionally disposed outside the metal cover 17, and adhesively secured on the base 16.

That is, the first oven controlled crystal oscillator has a configuration with double covers covering the electronic parts, which has the metal cover 17 inside, and the resin cover 18 outside. This configuration is also common to the second and the third oven controlled crystal oscillators described later.

By disposing the resin cover 18, the resin cover 18 serves as a wind guard even a wind is generated with a fan or similar mechanism within a unit including the oven controlled crystal oscillator, thus preventing an unnecessary heat radiation from the metal cover 17, restraining a current change caused by a frequent temperature control operation, and reducing an influence on the electronic parts inside the metal cover 17, thereby the output frequency is stabilized.

Furthermore, the resin cover 18 is formed of thermoplastic resin such as liquid crystal polymer and plastic, which is low in thermal conductivity compared with metal, so as not to be affected by heat from outside.

Specifically, the thermal conductivity of brass, which is a material of a common metal cover, is 106 $Wm^{-1}K^{-1}$, whereas the thermal conductivity of resin is 0.1 to 0.5 $Wm^{-1}K^{-1}$, which is considerably low compared with brass.

Furthermore, the resin cover 18 is formed to be one size larger in length, width and height than the metal cover 17, thus forming a clearance between the metal cover 17 and the resin cover 18.

The clearance is usually enclosed with air, and this air layer improves a heat insulation effect.

Setting the size of the resin cover 18 appropriately ensures the improved heat insulation effect without increasing the size of the oscillator.

Since resin is an insulator, there is no risk of short-circuit by contacting a terminal when the resin cover 18 is being mounted, therefore it requires no electric considerations.

Furthermore, the resin cover 18 can be bonded to the base 16 easier than metal with resin of a thermosetting type or a room temperature setting type.

Such a configuration achieves an oven controlled crystal oscillator of high stability at low cost.

Figure 2:
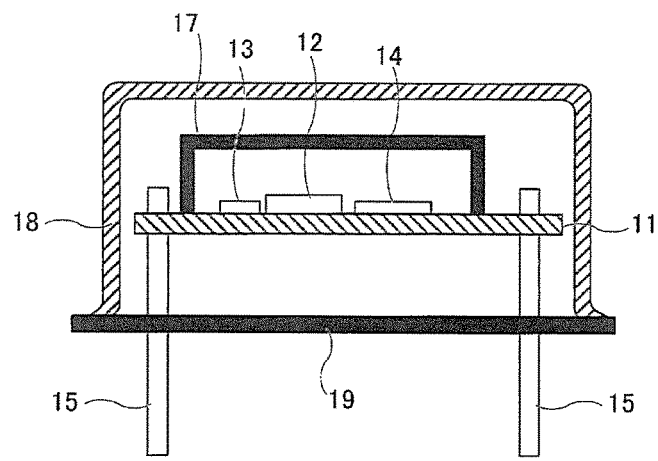
FIG. 2 is a sectional drawing illustrating a configuration of a second oven controlled crystal oscillator.

[Second Oven Controlled Crystal Oscillator: FIG. 2]

Next, as the oven controlled crystal oscillator according to the first embodiment, the second oven controlled crystal oscillator will be described by referring to FIG. 2. FIG.2 is a sectional drawing illustrating a configuration of the second oven controlled crystal oscillator.

As illustrated in FIG. 2, the second oven controlled crystal oscillator is a pin type (lead type) oscillator, which includes the oscillator circuit 12, the heater resistor 13, and the power transistor 14 mounted on the substrate 11 formed of glass epoxy or similar material, the metal cover 17 covering the electronic parts is mounted on the substrate 11, and the inside is sealed.

The electronic parts of the oscillator circuit 12 or similar part, and the metal cover 17 may be disposed on the lower surface of the substrate 11.

The substrate 11 is secured to a metal base 19 with the plurality of pins 15 disposed outside of the metal cover 17.

The metal base 19 has a penetration hole through which the pins 15 pass, and an insulator is filled inside the penetration hole and the peripheral area such that the pins 15 and the metal base 19 do not short circuit.

On the metal base 19, the resin cover 18, which is one size larger than the metal cover 17, is mounted and sealed so as to cover the upper portion of the substrate 11 on which the electronic parts are mounted, the metal cover 17, and the pins 15. A clearance (space) between the resin cover 18 and the metal cover 17 is enclosed with air, which is a state where an air layer is formed.

With this, the second oven controlled crystal oscillator prevents a wind generated with a fan or similar mechanism from hitting the metal cover 17 directly and reduces a heat influence on the electronic parts from outside to stabilize the output frequency, similarly to the first oven controlled crystal oscillator.

Figure 3:
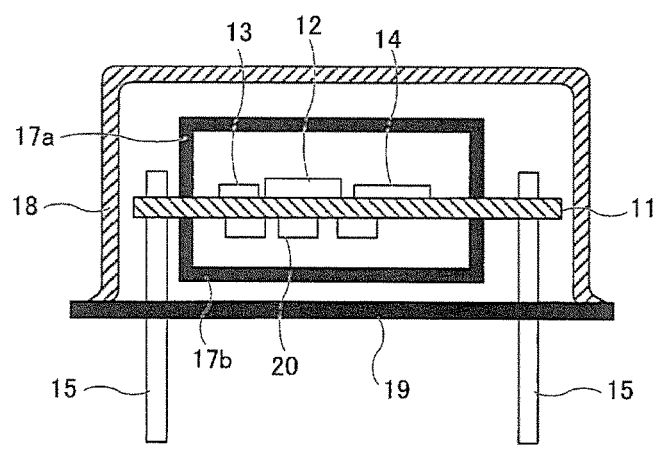
FIG. 3 is a sectional drawing illustrating a configuration of a third oven controlled crystal oscillator.

[Third Oven Controlled Crystal Oscillator: FIG. 3]

Next, as the oven controlled crystal oscillator according to the first embodiment, the third oven controlled crystal oscillator will be described by referring to FIG. 3. FIG. 3 is a sectional drawing illustrating a configuration of the third oven controlled crystal oscillator.

As illustrated in FIG. 3, the third oven controlled crystal oscillator is a pin type oscillator, similar to the second oven controlled crystal oscillator.

A featured part of the third oven controlled crystal oscillator is that the oscillator circuit 12, the heater resistor 13, and the power transistor 14 are mounted on one surface (here, a top surface) of the substrate 11, while other electronic parts 20 are mounted on the lower surface of the substrate 11.

Furthermore, the third oven controlled crystal oscillator includes, in addition to a metal cover (first metal cover) 17a that covers the electronic parts on the top side of the substrate 11, another metal cover (second metal cover) 17b that covers the electronic parts 20 of the lower surface on the lower surface of the substrate 11.

Here, the metal cover 17a opening downward and the metal cover 17b opening upward are formed such that the openings vertically overlap sandwiching the substrate 11 in between. A consecutive space is formed vertically sandwiching the substrate 11.

The substrate 11 has a through-hole that connects the electronic parts and/or the electrode mounted on the upper and lower surfaces of the substrate 11, and heat from the heater resistor 13 or similar parts on the top surface of the substrate 11 is conducted via the through-hole to a space in the lower surface side.

Covering both the surfaces of the substrate 11 with the metal cover 17a and 17b of excellent thermal conductivity to form a closed space internally facilitates the heat exchange between the upper and lower spaces of the substrate 11, then the uniformed of the temperature inside the oven is enhanced, and the accuracy of temperature control improves. Thereby the output frequency can be stabilized.

In the example of FIG. 3, although the oscillator circuit 12 and the heater resistor 13 are disposed on the top surface of the substrate 11, they may be disposed on the lower surface.

Furthermore, disposing the resin cover 18 outside the metal cover 17a and 17b prevents a wind of a fan or similar mechanism from hitting the metal cover 17a and 17b directly, and reduces the heat influence from outside, thereby the output frequency can be further stabilized.

[Effect of First Embodiment]

With the oven controlled crystal oscillator according to the first embodiment of the present invention, the oven controlled crystal oscillator includes the substrate 11 on which the oscillator circuit 12, the heater resistor 13, and the power transistor 14 are mounted, the substrate 11 is held and secured above the base 16 with the plurality of pins 15, the oven controlled crystal oscillator includes the metal cover 17, which covers the oscillator circuit 12, the heater resistor 13, and the power transistor 14, and the resin cover 18, which covers the outside of the metal cover 17, and an appropriate space (air layer) is formed between the metal cover 17 and the resin cover 18. Thus, the resin cover 18 prevents a wind generated with a fan or similar mechanism from hitting the metal cover 17 directly, and the air layer enhances the heat insulation effect, and reduces the useless heat radiation from the metal cover 17 to stabilize the temperature control, thereby it is effective to stabilize the output frequency.

With the oven controlled crystal oscillator according to the first embodiment of the present invention, it is applicable to any of the surface mount device type or the pin type oven controlled crystal oscillator, thereby it is effective to achieve an oven controlled crystal oscillator of high stability according to the purpose of use at low cost.

With the oven controlled crystal oscillator according to the first embodiment of the present invention, the above-described pin type oven controlled crystal oscillator includes the oscillator circuit 12, the heater resistor 13, the power transistor 14, and the metal cover 17*a*, which covers them, on the top surface of the substrate 11, and includes the electronic parts 20 and the metal cover 17*b*, which covers it, on the lower surface. The metal cover 17*a* and the metal cover 17*b* are mounted to vertically overlap the openings on the substrate 11. Therefore the whole space that is formed with the metal cover 17*a* and 17*b* vertically sandwiching the substrate 11 becomes an oven, in addition to the resin cover 18 in the outer side blocking a wind to reduce the heat influence from outside, and the temperature control can be stabilized, thereby it is effective to further stabilize the output frequency.

[Second Embodiment]

Next, an oven controlled crystal oscillator according to a second embodiment of the present invention will be described.

The oven controlled crystal oscillator according to the second embodiment is characterized in including a metal cover outside a resin cover covering an oscillator circuit or similar part.

A fourth to an eighth oven controlled crystal oscillator will be described as the concrete examples of the oven controlled crystal oscillator according to the second embodiment.

Figure 4:
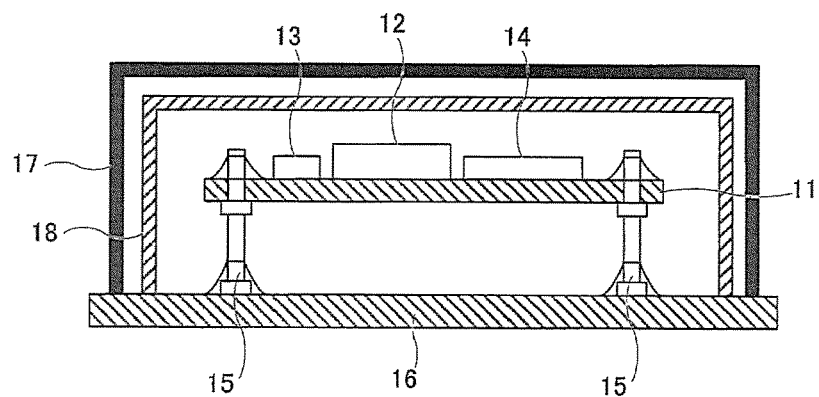
FIG. 4 is a sectional drawing illustrating a configuration of a fourth oven controlled crystal oscillator.

[Fourth Oven Controlled Crystal Oscillator: FIG. 4]

As the oven controlled crystal oscillator according to the second embodiment of the present invention, the fourth oven controlled crystal oscillator will be described by referring to FIG. 4. FIG. 4 is a sectional drawing illustrating a configuration of the fourth oven controlled crystal oscillator.

As illustrated in FIG. 4, the fourth oven controlled crystal oscillator includes the substrate 11 includes the oscillator circuit 12, the heater resistor 13, and the power transistor 14. The substrate 11 is held and secured above the base 16 formed of glass epoxy or similar material with the pins 15, and the resin cover 18 is mounted on the base 16 so as to cover the substrate 11 and the pins 15, and further the metal cover 17 is mounted on the outside of the resin cover 18.

The metal cover 17 is formed to be one size larger than the resin cover 18, and an appropriate space (air layer) is formed between the resin cover 18 and the metal cover 17.

Including the air layer enhances the heat insulation effect, and reduces the heat influence from outside.

The oven controlled crystal oscillator according to the second embodiment disposes the resin cover 18 of low thermal conductivity inside so as to keep the heat inside the oven, thus enabling the temperature control with a low electric power.

Furthermore, disposing the metal cover 17 outside the resin cover 18 provides the shield effect as well as a wind guard blocking the airflow to prevent the unnecessary heat radiation, and reduce the power consumption.

Figure 5:
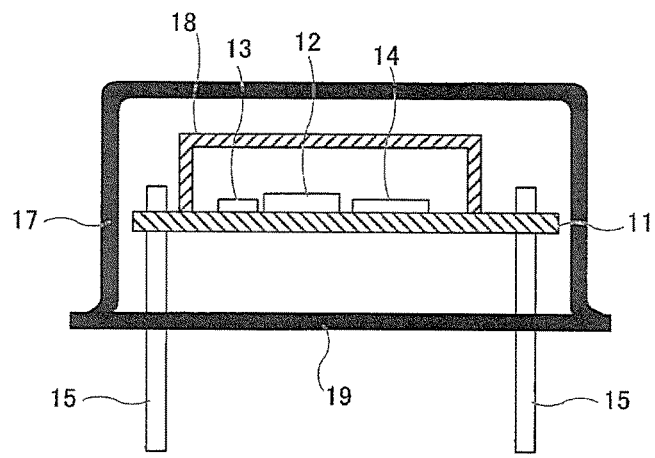
FIG. 5 is a sectional drawing illustrating a configuration of a fifth oven controlled crystal oscillator.

[Fifth Oven Controlled Crystal Oscillator: FIG. 5]

Next, as the oven controlled crystal oscillator according to the second embodiment, the fifth oven controlled crystal oscillator will be described by referring to FIG. 5. FIG. 5 is a sectional drawing illustrating a configuration of the fifth oven controlled crystal oscillator.

As illustrated in FIG. 5, the fifth oven controlled crystal oscillator is a configuration of a pin type oven controlled crystal oscillator including the resin cover 18, which covers an oscillator circuit 12, the heater resistor 13, and the power transistor 14, on the substrate 11, and the metal cover 17, which covers the resin cover 18, on the metal base 19 above which the substrate 11 is secured with the pins 15.

Figure 6:
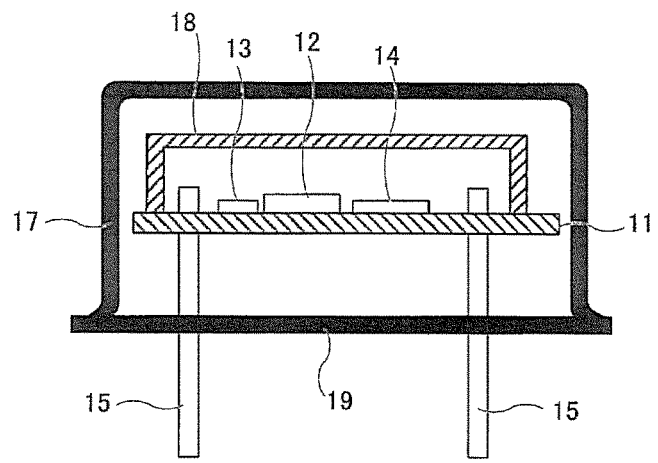
FIG. 6 is a sectional drawing illustrating a configuration of a sixth oven controlled crystal oscillator.

[Sixth Oven Controlled Crystal Oscillator: FIG. 6]

FIG. 6 is a sectional drawing illustrating a configuration of the sixth oven controlled crystal oscillator.

As illustrated in FIG. 6, the sixth oven controlled crystal oscillator is a configuration of a pin type, and the resin cover 18 inside covering the upper portion of the pins 15.

The sixth oven controlled crystal oscillator can also provide a similar effect to the fourth oven controlled crystal oscillator.

Figure 7:
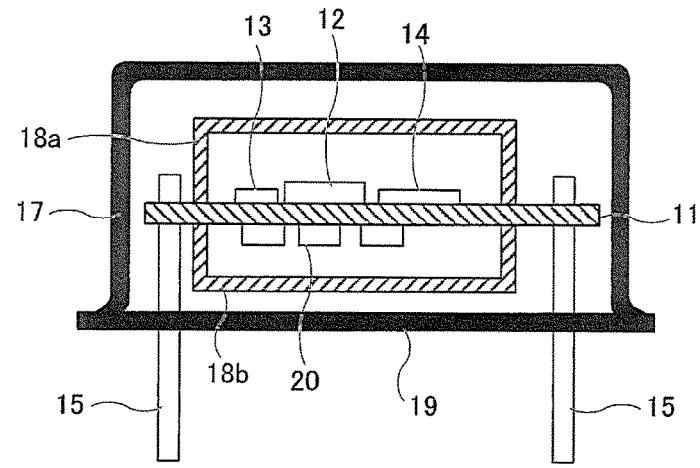
FIG. 7 is a sectional drawing illustrating a configuration of a seventh oven controlled crystal oscillator.

[Seventh Oven Controlled Crystal Oscillator: FIG. 7]

Next, as the oven controlled crystal oscillator according to the second embodiment, the seventh oven controlled crystal oscillator will be described by referring to FIG. 7. FIG. 7 is a sectional drawing illustrating a configuration of the seventh oven controlled crystal oscillator.

As illustrated in FIG. 7, the seventh oven controlled crystal oscillator is a pin type. The seventh oven controlled crystal oscillator includes the oscillator circuit 12 or similar part on the top surface of the substrate 11 and includes a resin cover (first resin cover) 18*a* to cover the oscillator circuit 12 or similar part on the top surface, and includes the electronic parts 20 on the lower surface and a resin cover (second resin cover) 18*b* to cover the electronic parts 20 of the lower surface.

Furthermore, the configuration is that the substrate 11 on which the parts or similar are mounted is secured above the metal base 19 with the pins 15, and includes the metal cover 17 that covers the upper portion of the resin cover 18*a* and 18*b*, the substrate 11, and the pins 15 on the metal base 19.

The openings of the resin cover 18*a* and 18*b* are formed to vertically overlap sandwiching the substrate 11, therefore the whole internal area between the resin cover 18*a* and 18*b* forms an oven, and the temperature control can be stabilized, thereby the output frequency can be further stabilized.

[Eighth Oven Controlled Crystal Oscillator]

Figure 8:
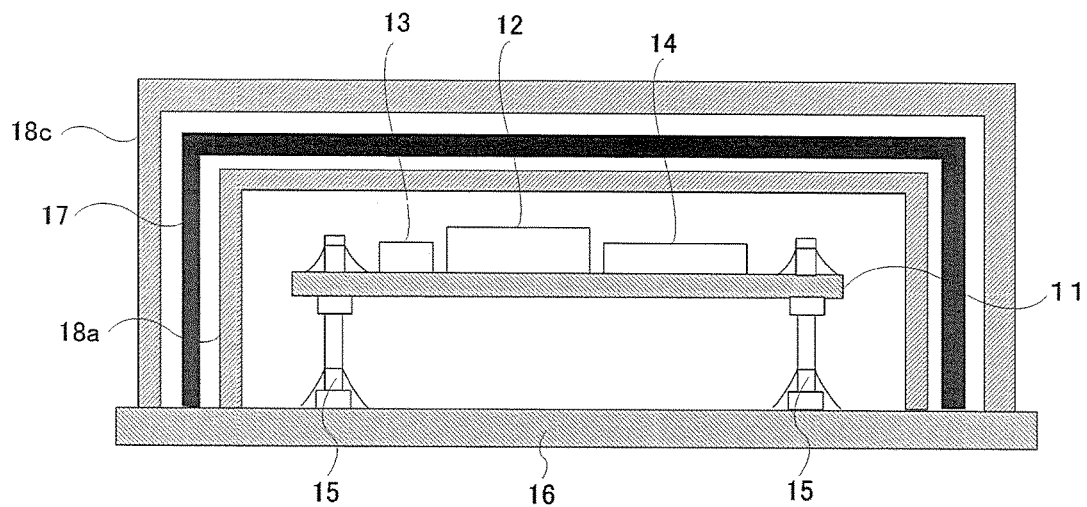
FIG. 8 is a sectional drawing illustrating a configuration of an eighth oven controlled crystal oscillator (surface mount device type).
Figure 9:
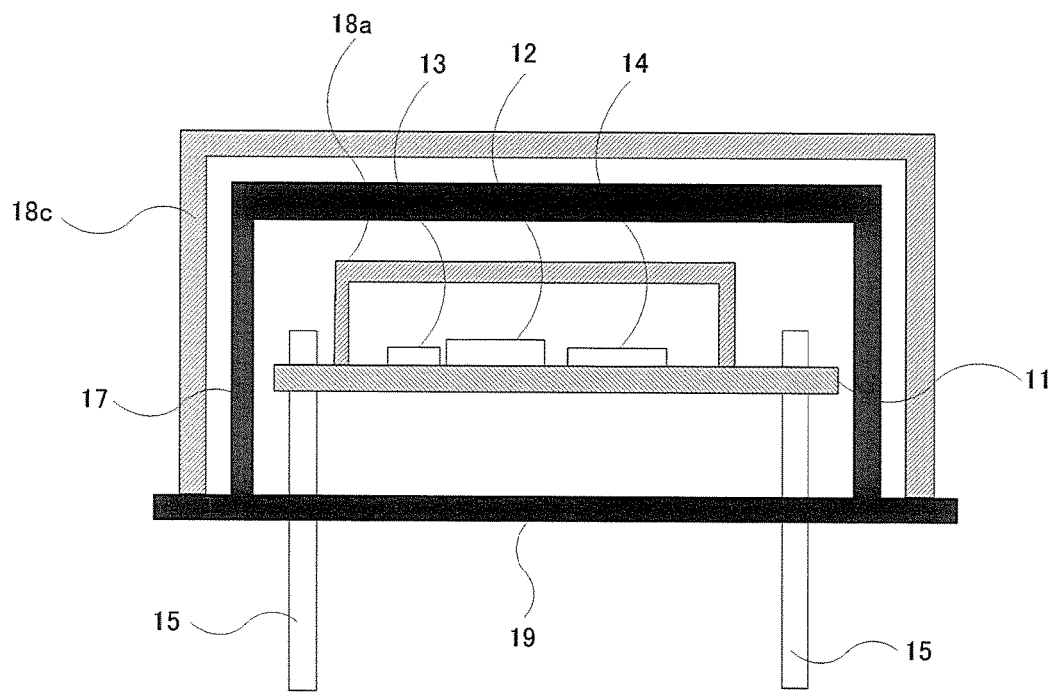
FIG. 9 is a sectional drawing illustrating a configuration of the eighth oven controlled crystal oscillator (pin type).

Next, as the oven controlled crystal oscillator according to the second embodiment, the eighth oven controlled crystal oscillator will be described by referring to FIG. 8 and FIG. 9. FIG. 8 is a surface mount device type, and FIG. 9 is a pin type.

The eighth oven controlled crystal oscillator has a configuration that the metal cover 17 is disposed outside the first resin cover 18*a* covering the oscillator circuit 12 or similar part, and another resin cover (third resin cover) 18c is further disposed outside the metal cover 17.

Then, between the first resin cover 18a and the metal cover 17, and between the metal cover 17 and the third resin cover 18c, appropriate air layers are formed.

Figure 10:
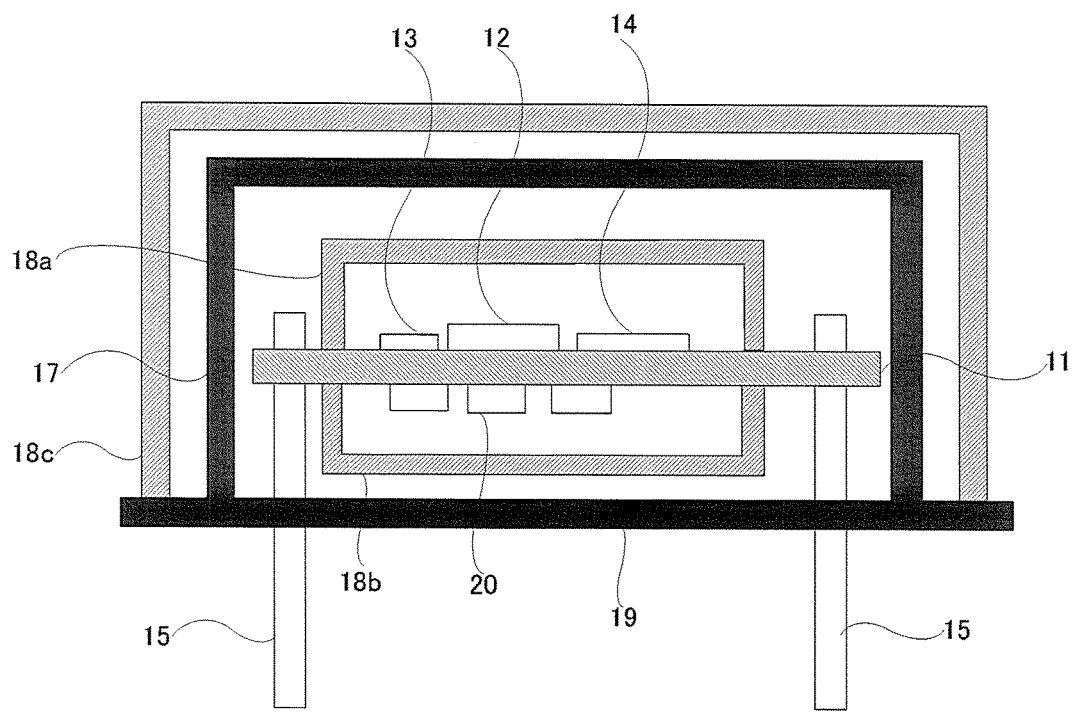
FIG. 10 is a sectional drawing illustrating a configuration of the eighth oven controlled crystal oscillator (including resin covers vertically overlapping).
Figure 11:
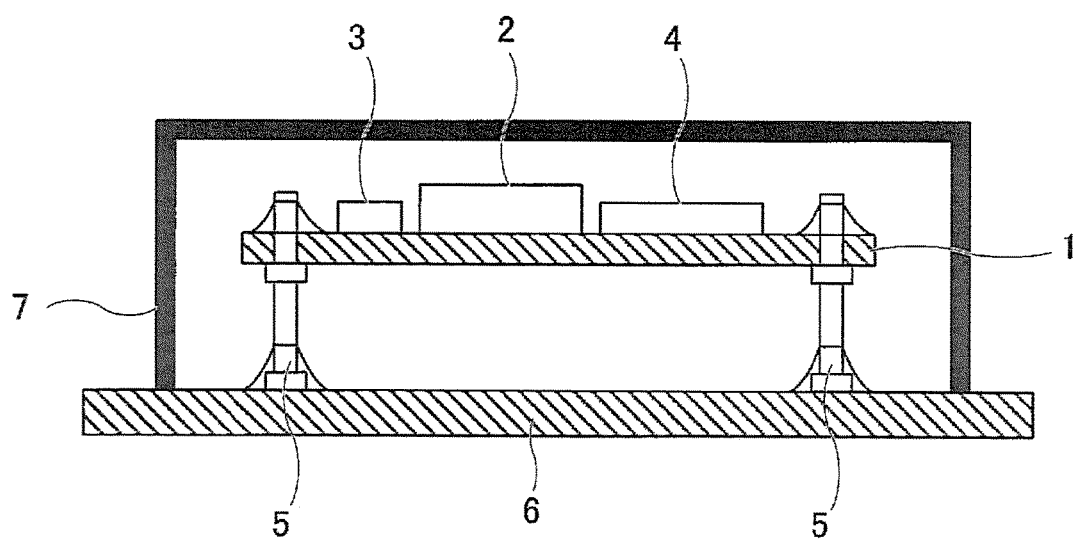
FIG. 11 is a sectional drawing illustrating a configuration of a conventional oven controlled crystal oscillator.

As illustrated in FIG. 10, the configuration may include another resin cover (third resin cover) 18c outside the metal cover 17 of the seventh oven controlled crystal oscillator, which is formed to have the openings of the resin cover 18a and 18b sandwiching the substrate 11, and vertically overlapping.

In this case, between the first resin cover 18a or the second resin cover 18b and the metal cover 17, and between the metal cover 17 and the third resin cover 18c, appropriate air layers are formed.

Thus, the eighth oven controlled crystal oscillator includes the triple covers in order to block a wind of an outer fan to achieve the shield effect, thereby further enhancing the effect to prevent the heat radiation from the oven.

[Effect of Second Embodiment]

With the oven controlled crystal oscillator according to the second embodiment of the present invention, the oven controlled crystal oscillator includes the substrate 11 on which the oscillator circuit 12, the heater resistor 13, and the power transistor 14 are mounted. The substrate 11 is held and secured above the base 16 with the plurality of pins 15. The oven controlled crystal oscillator includes the resin cover 18, which covers the oscillator circuit 12, the heater resistor 13, and the power transistor 14, and the metal cover 17, which covers the outside the resin cover 18. An appropriate space (air layer) is formed between the resin cover 18 and the metal cover 17. Thus, the resin cover 18, which is in the inner side, can internally store the heat, and the metal cover 17 has the shield effect as well as serving as a wind guard. Therefore the heat insulation effect is enhanced with the air layer, and the temperature control can be stabilized by reducing a useless heat radiation from the resin cover 18, thereby effectively stabilizing the output frequency.

With the oven controlled crystal oscillator according to the second embodiment of the present invention, it is applicable to any of the surface mount device type or the pin type of the oven controlled crystal oscillator, thereby it is effective to achieve an oven controlled crystal oscillator of high stability depending on usage at low cost.

Furthermore, with the oven controlled crystal oscillator according to the second the embodiment, the above-described pin type oven controlled crystal oscillator includes the electronic parts on both the top surface and the lower surface of the substrate 11, includes the resin cover 18a covering the top surface, and the resin cover 18b covering the lower surface of the substrate 11, and the resin cover 18a and the resin cover 18b are mounted to have the openings vertically overlapping on the substrate 11. Therefore, the whole space that the resin cover 18a and 18b sandwich the substrate 11 vertically forms an oven, and the metal cover 17 on the outside prevents a wind to stabilize the temperature control, thereby it is effective to further stabilize the output frequency.

With the oven controlled crystal oscillator according to the second embodiment, the oven controlled crystal oscillator includes the first resin cover 18a covering the oscillator circuit 12, the heater resistor 13, and the power transistor 14, the metal cover 17 covering the outside of the first resin cover 18a, and further, the third resin cover 18c covering the outside of the metal cover 17, and the air layers of the appropriate thickness are formed between the respective covers. Therefore the heat is stored inside the first resin cover 18a, the shield effect is provided with the metal cover 17, and a wind of a fan is blocked from hitting the metal cover 17, which is high in thermal conductivity, with the third resin cover 18c to reduce the heat radiation to further stabilize the temperature control, thereby it is effective to obtain a satisfactory output frequency signal.

INDUSTRIAL APPLICABILITY

The present invention is applicable to an oven controlled crystal oscillator that ensures the reduced heat influence from outside, and further stabilize the output frequency.

The invention claimed is:

1. An oven controlled crystal oscillator having a base and a substrate mounted above the base, comprising:
    an oscillator circuit, a heater resistor, and a temperature control circuit mounted on the substrate;
    a plurality of pins, securing the substrate above the base at a predetermined interval;
    a first metal cover, covering the oscillator circuit, the heater resistor, and the temperature control circuit; and
    a resin cover, mounted on the base, and the resin cover covering the first metal cover, wherein
    an air layer is formed between the first metal cover and the resin cover.

2. The oven controlled crystal oscillator according to claim 1, wherein
    the oven controlled crystal oscillator is a surface mount device type with the first metal cover and the resin cover mounted on the base.

3. The oven controlled crystal oscillator according to claim 1, wherein
    the oscillator circuit, the heater resistor, the temperature control circuit, and the first metal cover are mounted on a top surface of the substrate, and
    the resin cover is mounted on the base, the oven controlled crystal oscillator being a pin type.

4. The oven controlled crystal oscillator according to claim 3, further comprising:
    an electronic part and a second metal cover covering the electronic part mounted on a lower surface of the substrate, wherein
    the first metal cover and the second metal cover sandwich the substrate to form openings vertically overlapping.

5. An oven controlled crystal oscillator having a base and a substrate mounted above the base, comprising:
    an oscillator circuit, a heater resistor, and a temperature control circuit mounted on the substrate;
    a plurality of pins, securing the substrate above the base at a predetermined interval;
    a first resin cover, covering the oscillator circuit, the heater resistor, and the temperature control circuit; and
    a metal cover, mounted on the base, the metal cover covering the first resin cover, wherein
    a first air layer is formed between the first resin cover and the metal cover,
    wherein a second air layer is formed inside the first resin cover, and the second air layer is formed between the oscillator circuit, the heater resistor, and the temperature control circuit.

6. The oven controlled crystal oscillator according to claim 5, wherein
    the oven controlled crystal oscillator is a surface mount device type with the first resin cover and the metal cover mounted on the base.

7. The oven controlled crystal oscillator according to claim 5, wherein the oscillator circuit, the heater resistor, the temperature control circuit, and the first resin cover are mounted on a top surface of the substrate, and the metal cover is mounted on the base, the oven controlled crystal oscillator being a pin type.

8. The oven controlled crystal oscillator according to claim 7, further comprising:

an electronic part and a second resin cover covering the electronic part mounted on a lower surface of the substrate, and the first resin cover and the second resin cover sandwich the substrate to form openings vertically overlapping.

9. The oven controlled crystal oscillator according to claim 7, wherein the first resin cover further covers a plurality of pins in addition to the oscillator circuit, the heater resistor, and the temperature control circuit.

10. The oven controlled crystal oscillator according to claim 8, further comprising:

a third resin cover, disposed outside the metal cover, the third resin cover covering the metal cover.

* * * * *